United States Patent
Pavol et al.

(10) Patent No.: US 7,154,757 B1
(45) Date of Patent: Dec. 26, 2006

(54) MEDIA DRIVE VIBRATION ISOLATION AND ATTENUATION METHOD AND APPARATUS

(75) Inventors: Eric Grant Pavol, Louisville, CO (US); Charles Lee Still, Louisville, CO (US); Todd Baxendale, Broomfield, CO (US); Christopher McArdle, Northglenn, CO (US)

(73) Assignee: Storage Technology Corporation, Louisville, CO (US)

( * ) Notice: Subject to any disclaimer, the term of this patent is extended or adjusted under 35 U.S.C. 154(b) by 265 days.

(21) Appl. No.: 10/949,622

(22) Filed: Sep. 24, 2004

(51) Int. Cl.
*H05K 7/12* (2006.01)

(52) U.S. Cl. .................... 361/740; 361/747; 361/759; 361/801; 361/685

(58) Field of Classification Search ............. 361/802, 361/732, 724–727, 729, 741, 759, 740, 685; 312/223.3, 223.2
See application file for complete search history.

(56) References Cited

U.S. PATENT DOCUMENTS

| | | | | |
|---|---|---|---|---|
| 5,398,157 A | * | 3/1995 | Paul | 361/684 |
| 5,867,372 A | * | 2/1999 | Shie | 361/826 |
| 5,914,855 A | * | 6/1999 | Gustafson et al. | 361/685 |
| 6,614,653 B1 | * | 9/2003 | Armstrong et al. | 361/685 |
| 6,754,082 B1 | * | 6/2004 | Ding et al. | 361/727 |
| 6,819,560 B1 | * | 11/2004 | Konshak et al. | 361/687 |
| 6,831,832 B1 | * | 12/2004 | Haager et al. | 361/685 |
| 6,862,173 B1 | * | 3/2005 | Konshak et al. | 361/685 |

* cited by examiner

*Primary Examiner*—Kamand Cuneo
*Assistant Examiner*—Dameon E. Levi
(74) *Attorney, Agent, or Firm*—Brooks Kushman P.C.

(57) ABSTRACT

A method and apparatus are disclosed for isolating and attenuating shock and vibration in a disk module that includes media drives that are mounted on a printed circuit board (PCB). The apparatus includes a single printed circuit board (PCB), media drives that are coupled to the PCB, a first reinforcing rail that is attached to the PCB and to a first side of a first one of the media drives, a second reinforcing rail that is attached to the PCB and to a first side of a second one of the media drives, and a locking mechanism for locking the first and second rails together.

18 Claims, 6 Drawing Sheets

MEDIA DRIVE VIBRATION ISOLATION AND ATTENUATION METHOD AND APPARATUS

BACKGROUND OF THE INVENTION

1. Technical Field

The present invention is directed to media drives. More specifically, the present invention is directed to a method and apparatus for isolating and attenuating shock and vibration in a disk module that includes media drives that are mounted on a printed circuit board (PCB).

2. Description of Related Art

High performance disk drives are finely tuned electro-mechanical devices. The precision necessary to allow these devices to work is proportional to their capacity to hold customer data and their ability to handle the data in volume. Disk drive performance is dependent on the vendor's drive design that includes the servo algorithms, spindle and disk pack balancing, internal damping and dynamic characteristics. Disk drive performance is also influenced by the environment in which it must operate.

In an effort to reduce cost per megabyte of storage, the track density, or tracks per inch (TPI), have increased. The TPI trend, along with efforts to reduce packing costs and unit footprints, has led to significant challenges regarding disk drive implementation. Obstacles presented to the industry consist of damping and attenuating the disk drive's own internally generated vibrations, isolating the disk drive from vibrations created by neighboring disk drives, and isolating the disk drive from externally generated shocks and vibrations.

A poorly implemented disk drive mounting solution may cause various problems at a higher system level. An unconstrained, vibrating disk drive will tend to knock itself off track while performing a read or write seek. If the drive cannot successfully find the correct location to read or write on the disk surface, the disk drive must wait until the disk pack rotates around to the same location to attempt the operation again. The extra rotation results in a write or read inhibit that is treated as an error. These errors can affect the input/output speed of the individual disk drive and the system as a whole. If the problem is severe enough, the disk drive will be turned off or fenced due to its inability to read and write data. It is possible that the disk drive will be fenced due a system level mounting problem and not due to a problem with the disk drive itself. Corrective maintenance for shock and vibration induced errors will usually result in the replacement of a healthy disk drive.

Several approaches have been used in attempts to minimize the effects of self-induced vibrations, and externally induced shocks and vibrations on various disk drives. Many of these same approaches are also used with other moving-media type drives such as optical dives, magneto-optical drives, and tape drives, generically referred to as media drives.

A common shock and vibration damping approach is to attach each media drive to a system level drive tray through one or more springs. Springs provide a degree of mechanical isolation between neighboring media drives mounted in the drive tray, as well as isolation from externally induced shocks and vibrations. Springs, however, allow vibrational energy to remain in the media drive thus adding to the energy spectrum of the media drive environment. Springs also contact the media drive chassis in only a few specific locations that are selected based upon a center of mass and not based upon closeness to the vibration sources.

One method of mounting multiple media drives in a drive module is to attach the drives to a printed circuit board (PCB). The assembly of the drives mounted on the PCB is referred to as a drive module or a "blade". Drives mounted on a PCB disturb each other while seeking. Vibration is transmitted through the PCB, and any other rigid mechanism attached to the drives. Average performance losses of over 40% are seen due to the coupling of vibration from a seeking drive to a neighboring drive performing writes.

FIG. 1 is a perspective view of a drive module assembly 10, also referred to as a "blade", that includes a plurality of media drives secured to a single PCB and that utilizes a single solid rail for reinforcing the assembly in accordance with the prior art. Multiple media drives 12a and 12b are mounted on a single PCB 14. A single solid stiffening rail 16a is secured to the single PCB 14 and along a top side of both media drives 12a, 12b in order to reinforce the entire blade assembly 10. A second single stiffening rail 16b is secured along a second side of both media drives 12a, 12b to provide additional rigidity to blade 10. Each rail 16a and 16b is formed from a single piece of a material such as sheet metal. While this stiffening rail succeeds in reinforcing the rigidity of the blade assembly, the single rail also provides an efficient means for transmitting vibrations from one media drive to another.

Therefore, a need exists for a method and apparatus for isolating and attenuating shock and vibration in a disk module that includes media drives that are mounted on a printed circuit board (PCB).

SUMMARY OF THE INVENTION

A method and apparatus are disclosed for isolating and attenuating shock and vibration in a disk module that includes media drives that are mounted on a printed circuit board (PCB). The apparatus includes a single printed circuit board (PCB), media drives that are coupled to the PCB, a first reinforcing rail that is attached to the PCB and to a first side of a first one of the media drives, a second reinforcing rail that is attached to the PCB and to a first side of a second one of the media drives, and a locking mechanism for locking the first and second rails together.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A preferred embodiment of the present invention and its advantages are better understood by referring to the figures, like numerals being used for like and corresponding parts of the accompanying figures.

The present invention is a method and apparatus for isolating and attenuating shock and vibration in a disk module that includes media drives that are mounted on a printed circuit board (PCB). The apparatus includes a single printed circuit board (PCB), media drives that are coupled to the PCB, a first reinforcing rail that is attached to the PCB and to a first side of a first one of the media drives, a second reinforcing rail that is attached to the PCB and to a first side of a second one of the media drives, and a locking mechanism for locking the first and second rails together.

Figure 1:
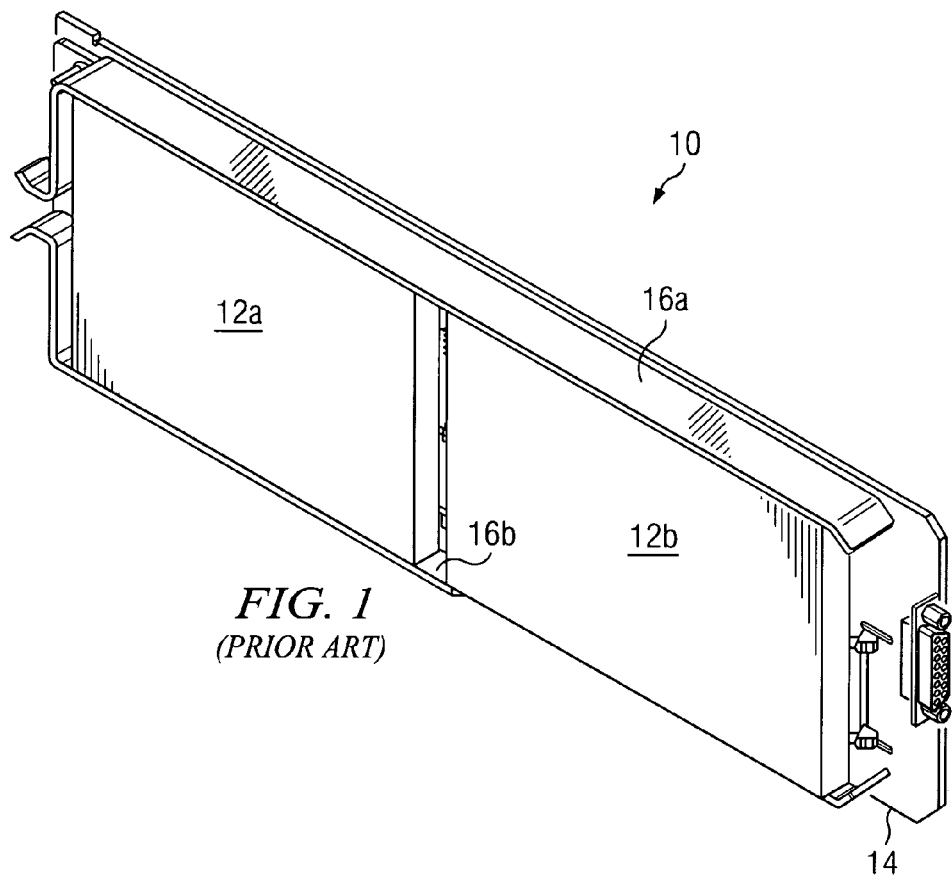
FIG. 1 is a perspective view of a drive module assembly, also referred to as a "blade", that includes a plurality of media drives secured to a single PCB and that utilizes a single solid rail for reinforcing the assembly in accordance with the prior art.
Figure 2:
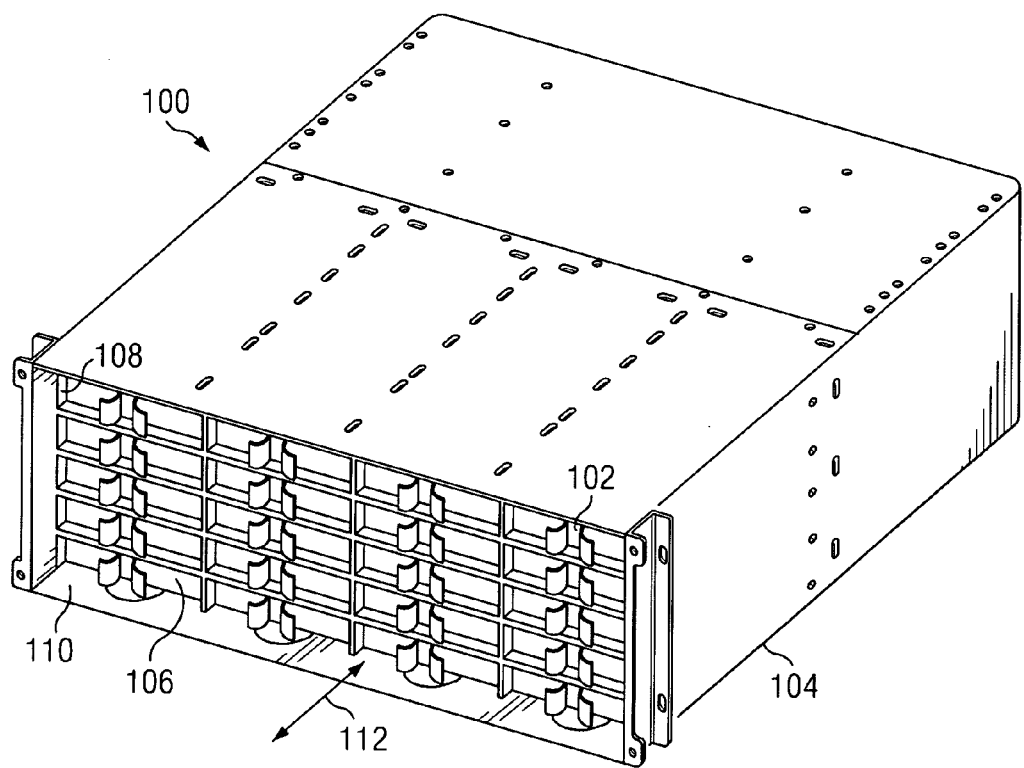
FIG. 2 is a perspective view of an example system implementing the present invention.

FIG. 2 is a perspective view of an example system implementing the present invention. An example system 100 that implements the present invention for multiple media drives 102 is shown in FIG. 2. In a preferred embodiment, each media drive 102 is a hard magnetic disk drive, although other types of drives may be enclosed by drive module 106. The system includes a drive tray 104 adapted to hold one or more blade assemblies, also called drive modules, 106. Each drive module can be inserted into, and removed from, a bay 108 in a drive tray housing 110. The bays 108 may be arranged in one dimension, two dimensions (as shown in FIG. 2), or in three-dimensional arrays. Multiple drive trays 104 may be stacked together to form larger systems 100 as required. In the preferred embodiment, the bays 108 are oriented to allow the drive modules 106 to be inserted and removed along a horizontal path, as shown by line 112. This preferred orientation is both convenient for a user of the system 100 and it helps keep the bays 108 free from dust and debris that may fall from above. Other orientations and insertion/removal paths may be used to meet space claim requirements for the drive tray 104 and user access requirements for the drive modules 106.

Figure 3:
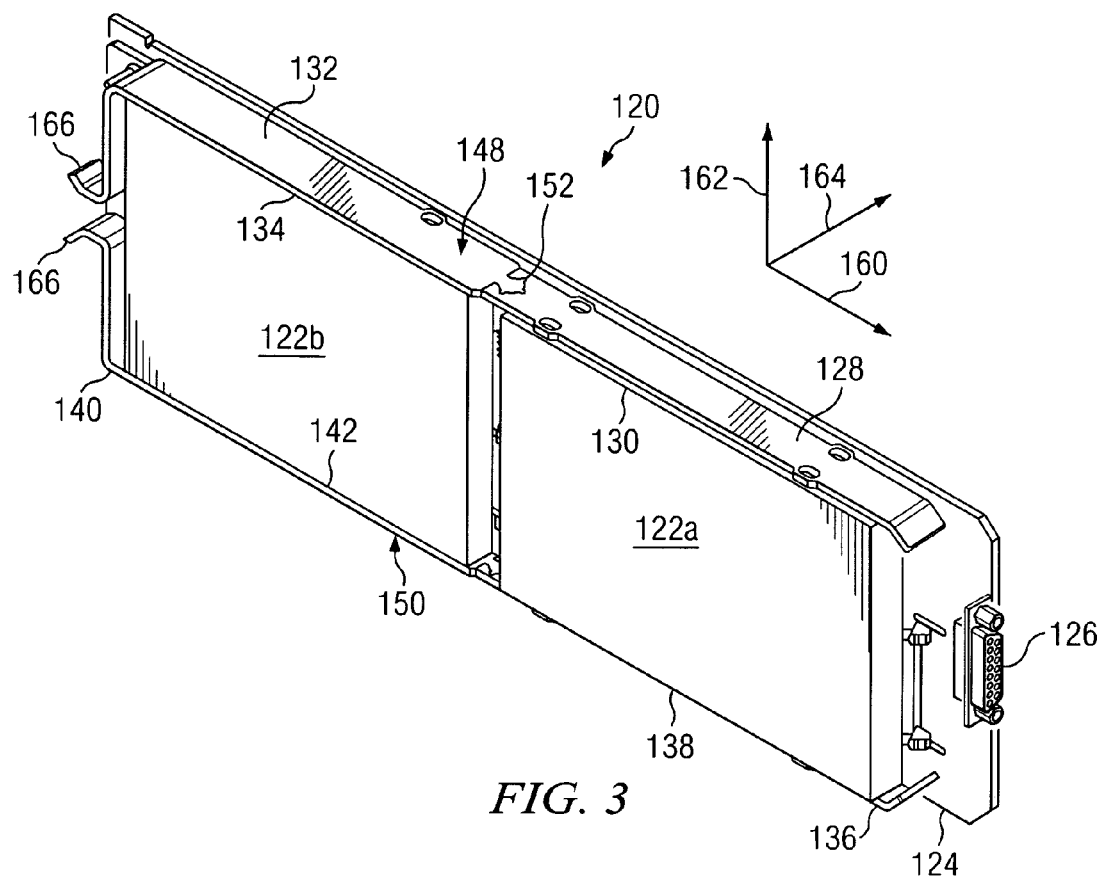
FIG. 3 is a perspective view of a first embodiment of an assembly that utilizes a plurality of rails for reinforcing the assembly that includes a plurality of media drives in accordance with the present invention art.

FIG. 3 is a perspective view of a first embodiment of an assembly 120 that utilizes a plurality of rails for reinforcing the assembly that includes a plurality of media drives 122a, 122b coupled to a single PCB in accordance with the present invention art. The media drives 122a, 122b are coupled to a single printed circuit board (PCB) 124. PCB 124 is formed from a single piece of material such that PCB 124 is one solid board. Media drives 122a and 122b are secured to PCB 124. PCB 124 includes an edge connector 126 that can be coupled to a motherboard (not shown) and is a means for providing all data and power signals to media drives 122a, 122b when PCB 124 is received within drive tray 104.

A plurality of reinforcing rails are provided in blade assembly 120 for reinforcing the rigidity of assembly 120. Rail 128 is coupled to PCB 124 and to a first side 130 of media drive 122a. Rail 132 is coupled to PCB 124 and to a first side 134 of media drive 122b. Rail 136 is coupled to PCB 124 and to a second side 138 of media drive 122a. Rail 140 is coupled to PCB 124 and to a second side 142 of media drive 122b.

Figure 5:
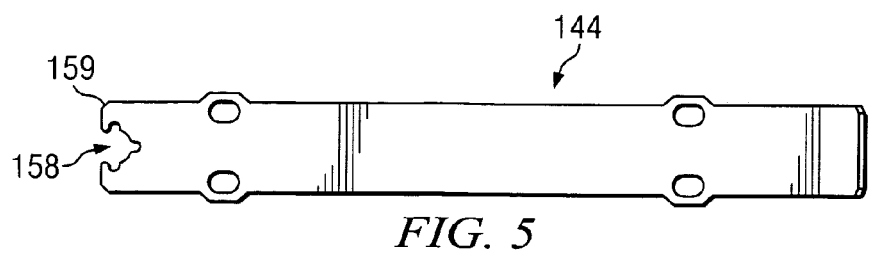
FIG. 5 is a top view of a first member of a rail assembly in accordance with the first embodiment of the present invention.
Figure 6:
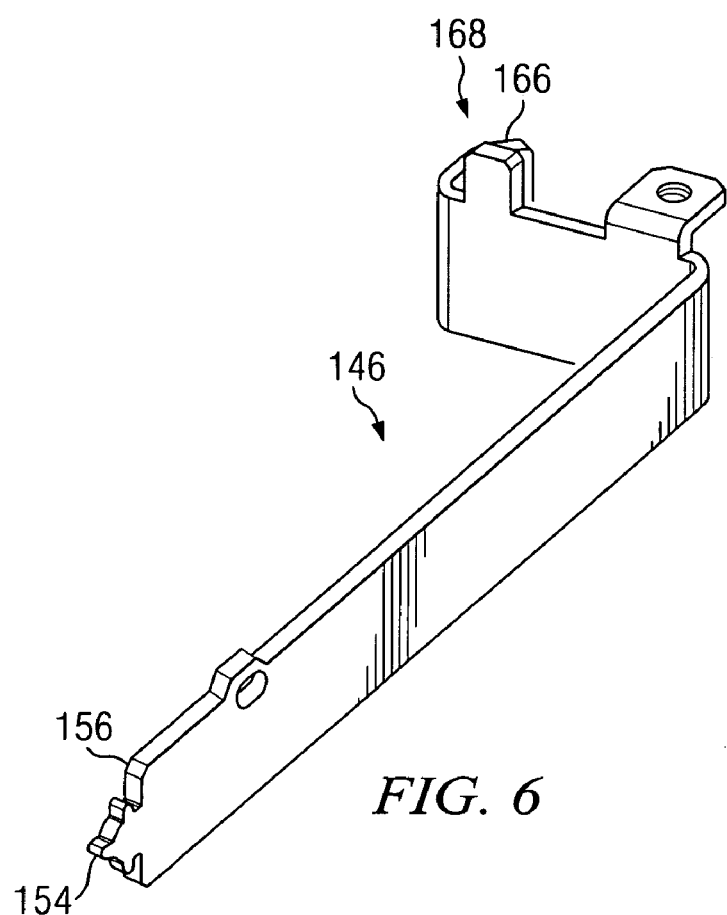
FIG. 6 is a perspective view of a second member of a rail assembly in accordance with the first embodiment of the present invention.
Figure 7:
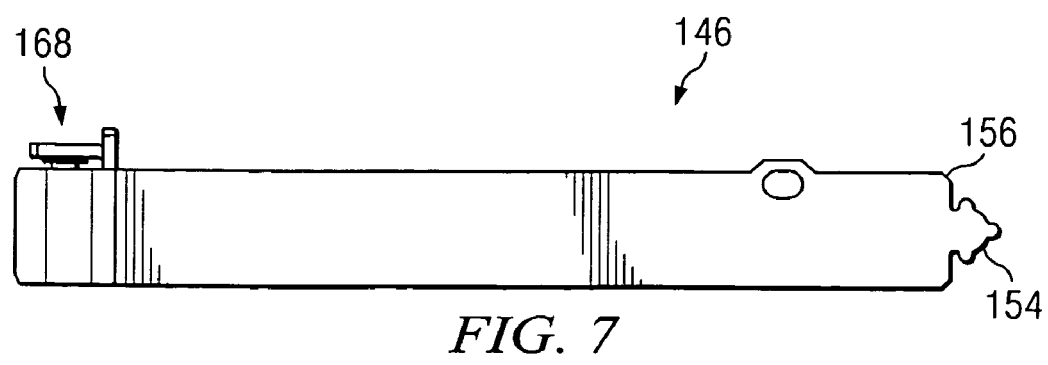
FIG. 7 is a top view of a second member of a rail assembly in accordance with the first embodiment of the present invention.

Rails 128 and 136 are a first member 144 (see FIGS. 4 and 5) while rails 132 and 140 are a second member 146 (see FIGS. 6 and 7).

Figure 4:
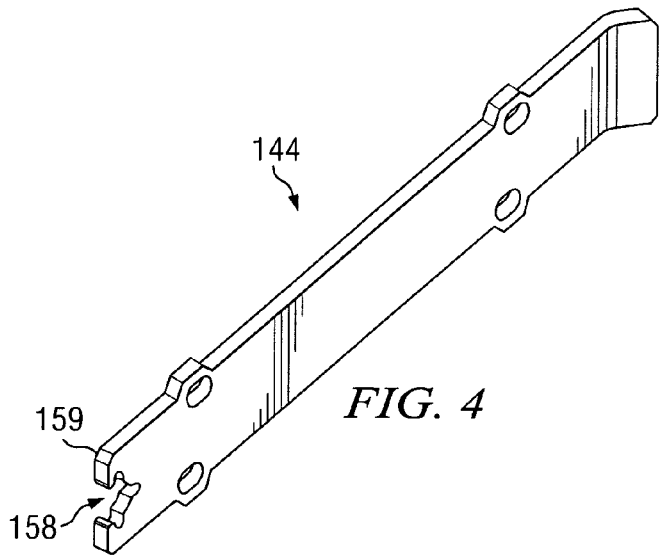
FIG. 4 is a perspective view of a first member of a rail assembly in accordance with a first embodiment of the present invention.

FIG. 4 is a perspective view of a first member in accordance with the present invention. FIG. 5 is a top view of a first member in accordance with the present invention.

Each first member 144 is a solid member formed from a single piece of material such as sheet metal. Each second member 146 is also a solid member formed from a single piece of material such as sheet metal.

Rail 128 and rail 132 are coupled together to form a rail assembly 148. Rail 136 and rail 140 are coupled together to form a rail assembly 150. Thus, a first member 144 and a second member 146 are coupled together to form each rail assembly.

First member 144 and second member 146 are coupled together to form each rail assembly using a locking mechanism 152. Locking mechanism 152 includes a tab 154 that is formed at the first end 156 of each second member 146 and a receptacle cut-out 158 that is formed in a first end 159 of first member 144. Tab 154 and cut-out 158 may be formed in any suitable shape. For example, tab 154 and cut-out 158 may be a simple rectangle or may be notched, as shown, to provide additional points of contact between tab 154 and cut-out 158.

First member 144 and second member 146 when coupled together by locking mechanism 152 to form rail assembly 148 give blade 120 its structure in a plane orthogonal to PCB 124 while permitting rail assembly 148 to maintain the needed stiffness. Rail assembly 148 does not transmit rotational vibration in the plane of the disks. Thus, media drives 122a, 122b are isolated by rail assembly 148.

When tab 154 is inserted into cut-out 158, a rail assembly, such as either rail assembly 148 or rail assembly 150, is formed. The insertion of tab 154 into cut-out 158 prevents movement of either first member 144 or second member 146 in a direction 160 or a z-direction 164 while permitting movement in vertical direction 162. Thus, locking mechanism 152 provides loose coupling in a vertical direction while providing more rigid coupling both a horizontal and z-direction.

When rail assembly 148 is secured to PCB 124 and media drives 122a, 122b, movement of either rail member 128 or rail member 132 in a vertical direction 162 is prohibited. In this manner, rail assembly 148 reinforces the rigidity of blade 120 by prohibiting any bending of blade 120 about the vertical axis 162.

Rotational vibration is transmitted along the plane of the PCB 124. Locking mechanism 152 significantly reduces the transmission of rotational vibration from one media drive to another. By providing two rail members, e.g. 128 and 132, instead of a single rail, e.g. 16a, and by coupling these members together utilizing locking mechanism 152, the transmission of rotational vibration from one media drive to another is reduced.

A flange 166 is formed on a second end 168 of second member 146 to provide a handle to assist in inserting blade 120 into and removing blade 120 from drive tray 104.

Figure 8:
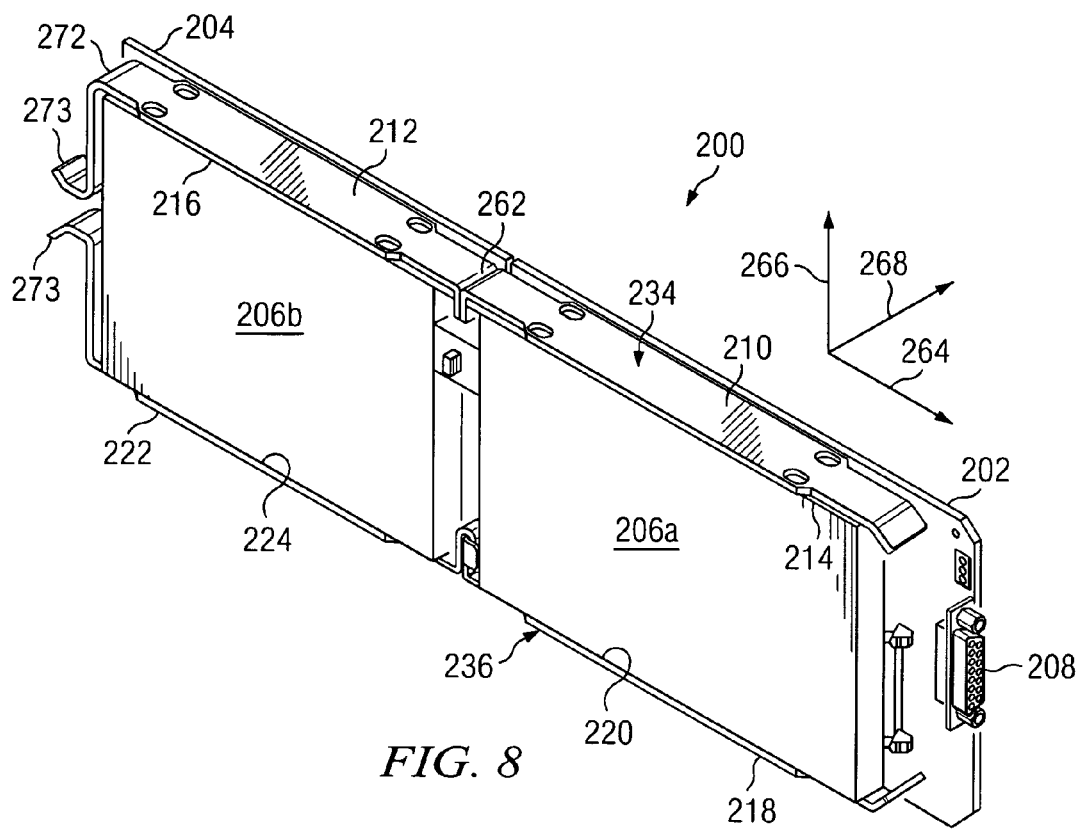
FIG. 8 is a front perspective view of a second embodiment of an assembly that utilizes a plurality of rails for reinforcing the assembly that includes a plurality of media drives coupled to a plurality of PCBs in accordance with the present invention.
Figure 9:
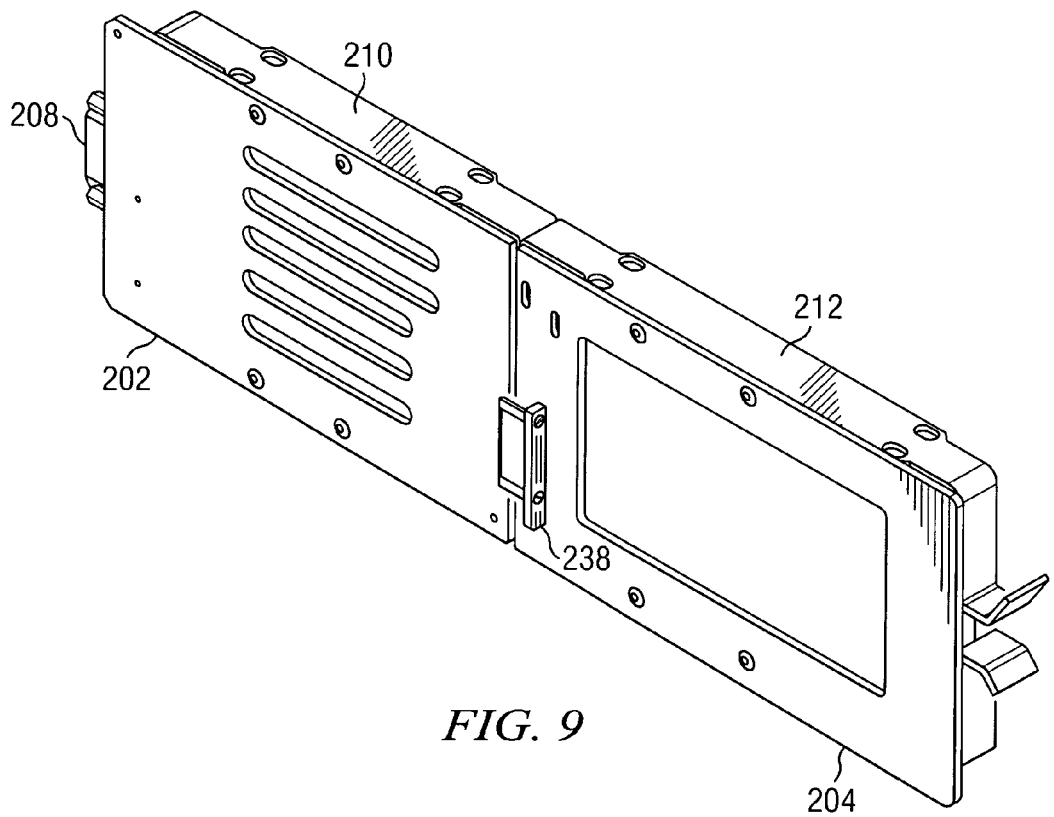
FIG. 9 is a back perspective view of a second embodiment of an assembly in accordance with the present invention.

FIG. 8 is a front perspective view of a second embodiment of an assembly 200 that utilizes a plurality of rails for reinforcing the assembly that includes a plurality of media drives 122a, 122b coupled to a plurality of PCBs in accordance with the present invention. FIG. 9 is a back perspective view of a second embodiment of an assembly 200 in accordance with the present invention.

The second embodiment isolates each media drive from the other media drives by cutting all rigid attachments between the drives. The second embodiment prevents motion without metal-to-metal contact in the rail assembly. Instead of providing a single solid PCB to which both media drives are coupled, each drive is coupled to its own separate PCB. In addition, the single rail 16a of the prior art is also divided into separate rails for each media drive. The resulting two-piece rail is coupled together using a locking mechanism to form a rail assembly by attaching the separate rails together in limited space without metal to metal contact which would transmit vibration. The locking mechanism used to attach the two separate rails together limits the degrees of freedom of the rail assembly while preserving the rigidity of the assembly 200.

Assembly 200 includes a first PCB 202 and a second PCB 204. Each media drive is coupled to its own separate PCB. For example, media drive 206a is coupled to PCB 202 and media drive 206b is coupled to PCB 204. Each PCB is formed from a single piece of material such that PCB 202 and PCB 204 are each one solid board. PCB 202 includes an edge connector 208 that is a means for providing all data and power signals to media drives 206a, 206b when PCB 202 is attached to a motherboard within drive tray 104.

A plurality of reinforcing rails are provided in blade assembly 200 for reinforcing the rigidity of assembly 200. Rail 210 is coupled to PCB 202 and to a first side 214 of media drive 206a. Rail 212 is coupled to PCB 204 and to a first side 216 of media drive 206b. Rail 218 is coupled to PCB 202 and to a second side 220 of media drive 206a. Rail 222 is coupled to PCB 204 and to a second side 224 of media drive 206b.

Figure 14:
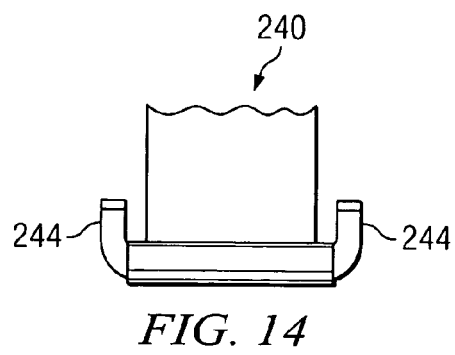
FIG. 14 is a partial top view of the first member, depicting the first end of the first member, of a rail assembly in accordance with the second embodiment of the present invention.
Figure 15:
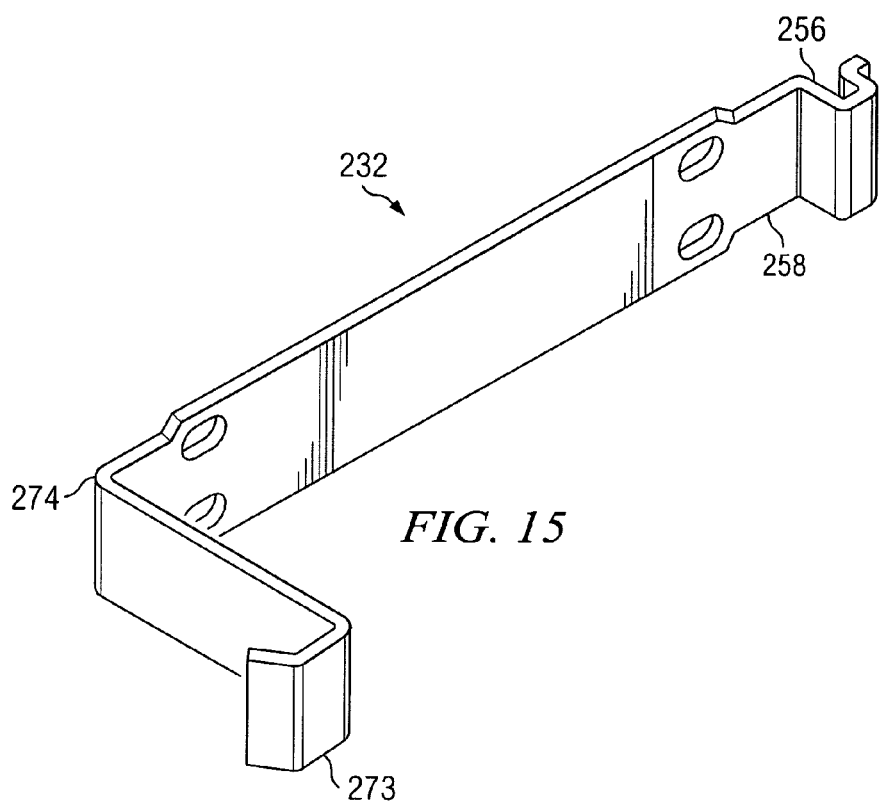
FIG. 15 is a perspective view of a second member of a rail assembly in accordance with the second embodiment of the present invention.
Figure 16:
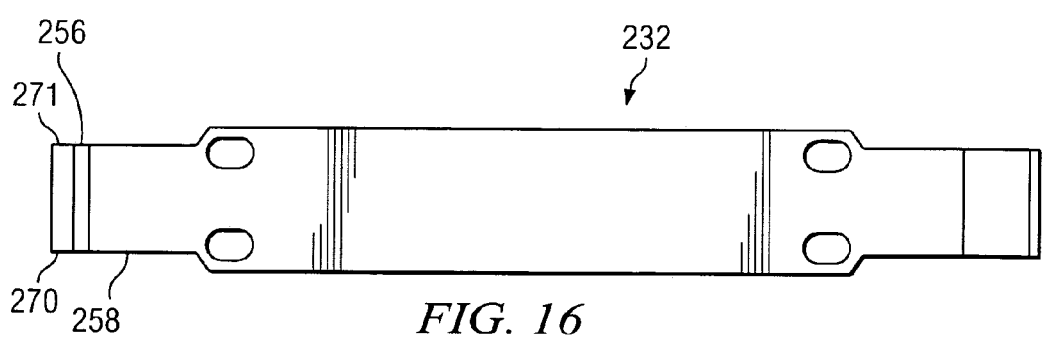
FIG. 16 is a top view of the second member of a rail assembly in accordance with the second embodiment of the present invention.
Figure 17:
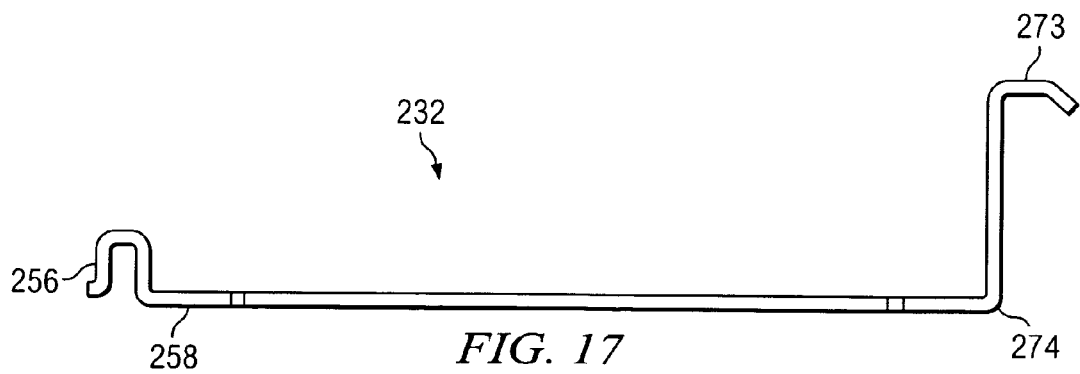
FIG. 17 is a side view of the second member of a rail assembly in accordance with the second embodiment of the present invention.

Rails 210 and 218 are a first member 230 (see FIGS. 10–14) while rails 212 and 222 are a second member 232 (see FIGS. 15–17). Each first member 230 is a solid member formed from a single piece of material such as sheet metal. Each second member 232 is also a solid member formed from a single piece of material such as sheet metal.

Figure 10:
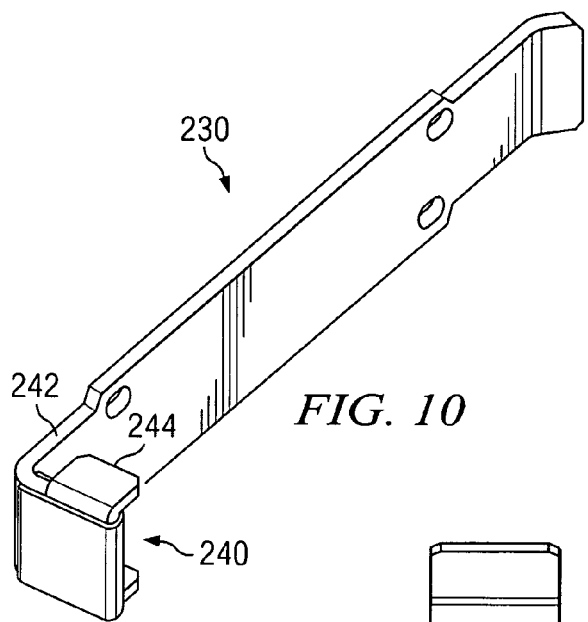
FIG. 10 is a perspective view of a first member of a rail assembly in accordance with the second embodiment of the present invention.
Figure 11:
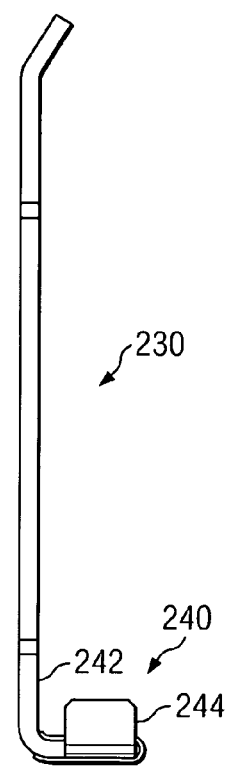
FIG. 11 is a side view of the first member of a rail assembly in accordance with the second embodiment of the present invention.
Figure 13:
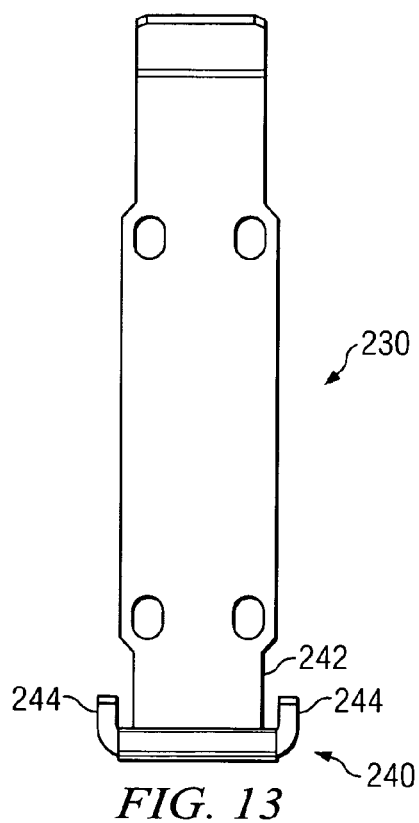
FIG. 13 is a top view of the first member of a rail assembly in accordance with the second embodiment of the present invention.
Figure 12:
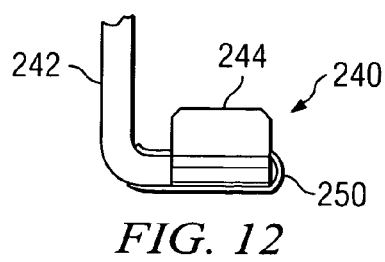
FIG. 12 is a partial side view of the first member, depicting the first end of the first member, of a rail assembly in accordance with the second embodiment of the present invention.

FIG. 10 is a perspective view of a first member of a rail assembly in accordance with the second embodiment of the present invention. FIG. 11 is a side view of the first member of a rail assembly in accordance with the second embodiment of the present invention. FIG. 12 is a partial side view of the first member, depicting the first end of the first member, of a rail assembly in accordance with the second embodiment of the present invention. FIG. 13 is a top view of the first member of a rail assembly in accordance with the second embodiment of the present invention. FIG. 14 is a partial top view of the first member, depicting the first end of the first member, of a rail assembly in accordance with the second embodiment of the present invention.

FIG. 15 is a perspective view of a second member of a rail assembly in accordance with the second embodiment of the present invention. FIG. 16 is a top view of the second member of a rail assembly in accordance with the second embodiment of the present invention. FIG. 17 is a side view of the second member of a rail assembly in accordance with the second embodiment of the present invention.

Rail 210 and rail 212 are coupled together to form a rail assembly 234. Rail 218 and rail 222 are coupled together to form a rail assembly 236. Thus, a first member 230 and a second member 232 are coupled together to form each rail assembly. First member 230 and second member 232 are coupled together to form each rail assembly using a locking mechanism 262.

First member 230 includes an L-shaped male connector 240 formed on a first end 242 of first member 230. Connector 240 includes a pair of locking tabs. One locking tab 244 is formed on each side of connector 240 for locking first member 230 into second member 232. Second member 232 includes a U-shaped female connector 256 formed on a first end 258 of second member 232. When connector 240 is inserted into connector 256, a locking mechanism 262 is formed that locks first member 230 to second member 232 to form either rail assembly 234 or rail assembly 236. Neither rail assembly transmits rotational vibration in the plane of the disks.

When connector 240 is inserted into connector 256 a rail assembly, such as rail assembly 234 or rail assembly 236 is formed. Locking mechanism 262 prevents movement of either first member 230 or second member 232 in a direction 264. Locking mechanism 262 also prevents rotation of first member 230 or second member 232 about a vertical axis 266.

When first member 230 is coupled to second member 232, locking tabs 244 surround connector 256 such that each tab 244 abuts an outside surface 270 or 271 of each side of connector 256. In this manner, locking tabs 244 prohibit movement in a z-direction 268 of first member 230 with respect to second member 232 when first member 230 and second member 232 are coupled together.

A flange 273 is formed on a second end 274 of second member 232 to provide a handle to assist in inserting blade 200 into and removing blade 200 from drive tray 104.

A damping material 250 is wrapped around connector 240 to further damp vibrations from being transmitted between first member 230 and second member 232 when the two members are coupled together and to prevent metal-to-metal contact. Damping material 250 preferably includes an adhesive for securing damping material 250 to connector 240.

Data and power signals are communicated with a motherboard (not shown) via connector 208. These data and power signals are communicated from PCB 202 to PCB 204 via a flexible circuit 238.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus in a drive module for isolating and attenuating shock and vibration among media drives that are mounted on a printed circuit board, said apparatus comprising:
   a single printed circuit board (PCB);
   a plurality of media drives coupled to said PCB;
   a first reinforcing rail attached to said PCB and to a first side of a first one of said plurality of media drives;
   a second reinforcing rail attached to said PCB and to a first side of a second one of said plurality of media drives; and
   a locking mechanism for locking said first and second rails together.

2. The apparatus according to claim 1, further comprising:
   said locking mechanism including a tab formed on a first end of said first rail;
   said locking mechanism including a cut-out formed in a first end of said second rail; and
   said first and second rails being locked together by inserting said tab into said cut-out to form a rail mechanism.

3. The apparatus according to claim 1, further comprising: said tab being notched.

4. The apparatus according to claim 1, further comprising: said tab being rectangular.

5. The apparatus according to claim 1, further comprising:
   a third reinforcing rail attached to said PCB and to a second side of said first one of said plurality of media drives;
   a fourth reinforcing rail attached to said PCB and to a second side of said second one of said plurality of media drives; and
   a second locking mechanism for locking said third and fourth rails together.

6. The apparatus according to claim 5, further comprising:
   said second locking mechanism including a tab formed on a first end of said third rail;
   said second locking mechanism including a cut-out formed in a first end of said fourth rail; and
   said third and fourth rails being locked together by inserting said tab into said cut-out for forming a second rail assembly.

7. The apparatus according to claim 1, further comprising:
   said locking mechanism preventing rotational vibrations from being transmitted between said plurality of media drives.

8. The apparatus according to claim 1, further comprising:
   said locking mechanism preventing rotation of said first and second rails about a vertical axis.

9. An apparatus in a drive module for isolating and attenuating shock and vibration among media drives that are mounted on a printed circuit board, said apparatus comprising:
   said drive module including a plurality of printed circuit boards (PCB);
   a plurality of media drives, each one of said plurality of media drives being coupled to a different one of said plurality of PCBs, wherein each one of said plurality of media drives is secured to its own PCB;
   a first reinforcing rail attached to a first one of said plurality of PCBs and to a first side of a first one of said plurality of media drives;
   a second reinforcing rail attached to a second one of said plurality of PCBs and to a first side of a second one of said plurality of media drives; and
   a locking mechanism for locking said first and second rails together.

10. The apparatus according to claim 9, further comprising:
    said locking mechanism including an L-shaped male connector formed on a first end of said first rail;
    said locking mechanism including a U-shaped female connector formed on a first end of said second rail; and
    said first and second rails being locked together by inserting said male connector into said female connector.

11. The apparatus according to claim 10, further comprising:
    a damping material secured to said male connector for reducing transmissions of vibrations from one of said media drives to another of said media drives.

12. The apparatus according to claim 10, further comprising:
    a pair of tabs including a first tab formed on a first side of said male connector and a second tab formed on a second side of said male connector; and
    said pair of tabs for preventing movement of said first and second rails along a z-axis.

13. The apparatus according to claim 10, further comprising:
    a flange included on a second end of said second rail for providing a handle for inserting and removing said disk module into a drive tray.

14. The apparatus according to claim 9, further comprising:
    a third reinforcing rail attached to said first one of said plurality of PCBs and to a second side of said first one of said plurality of media drives;
    a fourth reinforcing rail attached to said second one of said plurality of PCBs and to a second side of said second one of said plurality of media drives; and
    a second locking mechanism for locking said third and fourth rails together.

15. The apparatus according to claim 9, further comprising:
    said locking mechanism preventing rotational vibrations from being transmitted between said plurality of media drives.

16. The apparatus according to claim 9, further comprising:
    said locking mechanism preventing rotation of said first rail with respect to said second rail about a vertical axis and said third rail with respect to said fourth rail about said vertical axis.

17. The apparatus according to claim 9, further comprising:
    said first and second ones of said plurality of PCBs being separate and disconnected from each other.

18. The apparatus according to claim 9, further comprising:
    a flexible circuit for transmitting data and power signals from said first one of said plurality of PCBs to said second one of said plurality of PCBs.

* * * * *